(12) United States Patent
Rinne

(10) Patent No.: US 9,978,644 B1
(45) Date of Patent: May 22, 2018

(54) SEMICONDUCTOR DEVICE AND MANUFACTURING METHOD

(71) Applicant: Amkor Technology, Inc., Tempe, AZ (US)

(72) Inventor: Glenn Rinne, Apex, NC (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days. days.

(21) Appl. No.: 15/258,001

(22) Filed: Sep. 7, 2016

(51) Int. Cl.
| | |
|---|---|
| *H01L 21/00* | (2006.01) |
| *H01L 21/78* | (2006.01) |
| *H01L 21/02* | (2006.01) |
| *H01L 21/311* | (2006.01) |
| *H01L 21/683* | (2006.01) |

(52) U.S. Cl.
CPC ........ *H01L 21/78* (2013.01); *H01L 21/02118* (2013.01); *H01L 21/02263* (2013.01); *H01L 21/31138* (2013.01); *H01L 21/6836* (2013.01); *H01L 2221/68327* (2013.01)

(58) Field of Classification Search
CPC ............... H01L 21/78; H01L 21/02118; H01L 21/31138; H01L 21/6836; H01L 21/02263; H01L 2221/68327
USPC ....................................................... 438/465
See application file for complete search history.

(56) References Cited

U.S. PATENT DOCUMENTS

| | | | | |
|---|---|---|---|---|
| 7,180,173 | B2 * | 2/2007 | Kuo .................... | H01L 23/3128 174/548 |
| 2002/0094533 | A1 * | 7/2002 | Hess .................... | B01J 19/0046 435/6.14 |
| 2002/0172024 | A1 * | 11/2002 | Hui ......................... | H01L 21/56 361/767 |
| 2009/0102038 | A1 * | 4/2009 | McElrea ............. | H01L 23/3114 257/686 |
| 2010/0052087 | A1 * | 3/2010 | McElrea ........... | H01L 27/14618 257/433 |
| 2014/0335658 | A1 * | 11/2014 | Scanlan .................. | H01L 21/78 438/113 |
| 2015/0162141 | A1 * | 6/2015 | Tornay .............. | B01L 3/502707 216/2 |
| 2015/0243575 | A1 * | 8/2015 | Strothmann ........ | H01L 23/3114 257/773 |
| 2015/0255273 | A1 * | 9/2015 | Miao ....................... | H01L 21/78 257/622 |
| 2015/0279808 | A1 * | 10/2015 | Shen ................. | H01L 21/30604 257/773 |

* cited by examiner

*Primary Examiner* — Vu A Vu
(74) *Attorney, Agent, or Firm* — McAndrews, Held & Malloy, Ltd.

(57) ABSTRACT

Methods of dicing a wafer into a plurality of singulated dies are disclosed. Some methods coating sidewalls of the singulated dies with a polymer. The polymer may cover cracks formed in the sidewalls as result of dicing the wafer. Other methods may fill cracks formed in the sidewalls with a polymer. Such coating and/or filling of cracks may increase the structural integrity of the die.

20 Claims, 10 Drawing Sheets

SEMICONDUCTOR DEVICE AND MANUFACTURING METHOD

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Various aspects of this disclosure provide a method for manufacturing a semiconductor device and a semiconductor device produced thereby. For example and without limitation, various aspects of this disclosure provide a method for manufacturing a semiconductor device, and a semiconductor device produced thereby, comprising a singulated die having sidewalls and a sealant applied to the sidewalls of the singulated die.

DETAILED DESCRIPTION

Figure 1:
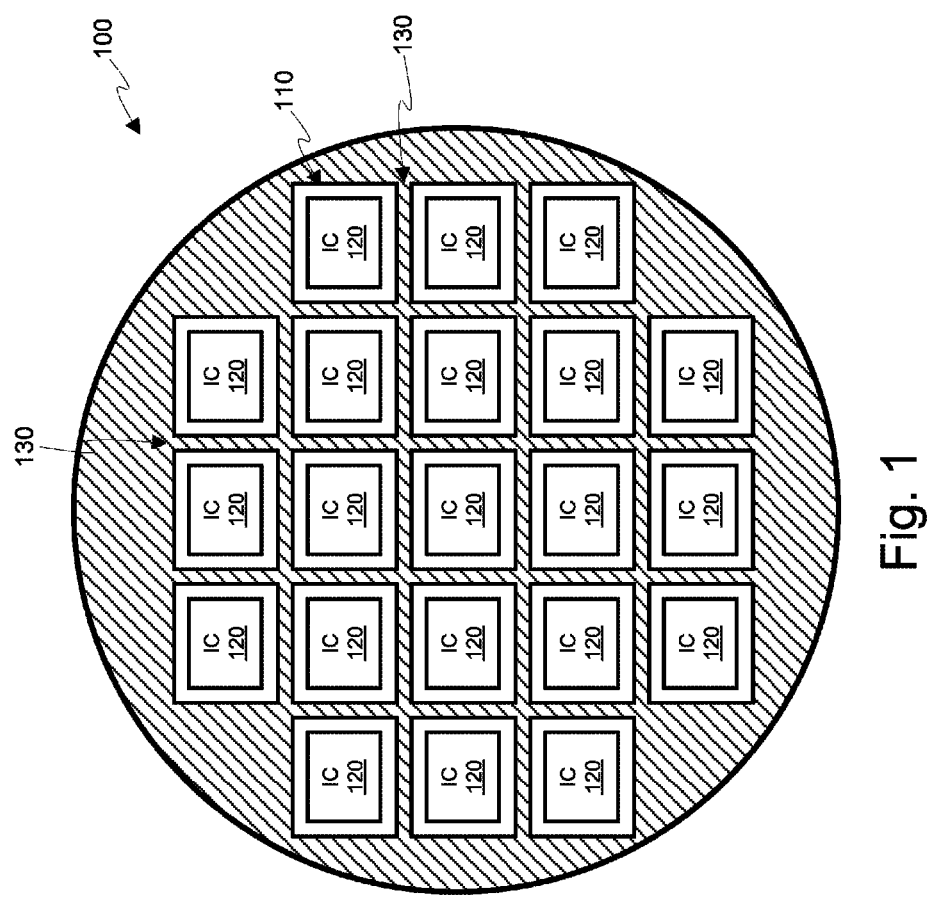
FIG. 1 shows a wafer having a plurality of integrated circuit dies.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a component may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

Various methods for manufacturing a semiconductor device and semiconductors devices resulting from such manufacturing methods are described herein by way of example and not by way of limitation in the accompanying figures. For clarity of illustration, exemplary elements illustrated in the figures may not necessarily be drawn to scale. In this regard, for example, the dimensions of some of the elements may be exaggerated relative to other elements. Furthermore, where considered appropriate, reference labels have been repeated among the figures to indicate corresponding or analogous elements.

Manufacturing integrated circuits generally includes forming integrated circuits from semiconductor material. Typically, such semiconductor integrated circuits are produced in large batches on a single wafer of silicon or other semiconductor material through processes such as photolithography. The wafer may be cut, diced, or otherwise singulated into many pieces, each containing a copy of the formed integrated circuit. Each of these pieces may be referred to as a chip or die.

Wafer dicing generally refers to this process by which a wafer is separated into several dies. The dicing process may involve scribing, breaking, mechanical sawing, or laser cutting. Following the dicing process, the individual silicon chips may be packaged or otherwise encapsulated into chip carriers, which are suitable for use in building electronic, semiconductor devices.

During dicing, wafers may be mounted on dicing tape which has a sticky backing that holds the wafer on a thin sheet metal frame. Once a wafer has been diced, the pieces left on the dicing tape are referred to as dies or chips. Each die may be packaged in a suitable package or placed directly on a printed circuit board substrate as a "bare die". The areas of the wafer that have been cut away, called die streets, are typically about 75 micrometers (μm) wide. Once a wafer has been diced, the singulated dies may stay on the dicing tape until they are extracted by die-handling equipment, such as a die bonder or die sorter.

The size of the singulated die may range from 35 mm to 0.1 mm square. The singulated die may be any shape, but are typically rectangular or square-shaped. In some cases, the singulated die may be other shapes, depending on the dicing method used.

Regardless, the dicing process may cause lattice or other physical damage along the sawn edges or sidewalls of the die. Such damage may leave the singulated die susceptible to further damage if the damaged edges are subject to further physical contact. As noted above, dies may be placed directly on a printed circuit board substrate as a "bare die." In such embodiments, the sidewalls of the die may be exposed and thus potentially subjected to further physical contact. For example, the sidewalls may be subjected to physical contact during the process of mounting the die to a printed circuit board, during shipment of the die to a circuit board assembler, during assembly of an electronic device using a circuit board to which the die is mounted, etc. Beyond bare dies, various packaging methods may also leave the sidewalls exposed. For example, chip-scale packages (CSP), wafer-level chip-scale packages (WLCSP), and other types of packages may leave the sidewalls of the die or chip exposed.

Various dicing methods are described herein in which sidewalls of the singulated die are coated with a sealant or other material. By coating the sidewalls, such dicing methods may help prevent further structural damage to the sidewalls and may help prevent cracks and other structural damage from propagating from the sidewalls to integrated circuit components of the die. In this manner, such dicing methods may help increase yield and effective lifetime of semiconductor devices manufactured from dies singulated per the described dicing methods.

Referring now to FIG. 1, a wafer 100 is shown comprising an array of dies 110. Each die 110 may include an integrated circuit (IC) 120 and may have a generally rectangular or square shape. Furthermore, the wafer 100 may include scribe lines or streets 130, which run between and divide the dies 110. The streets 130 generally provide rows and columns along which a saw or other dicing tool may pass during a dicing process without harming the integrated circuits 120 of the dies 110.

Figure 2:
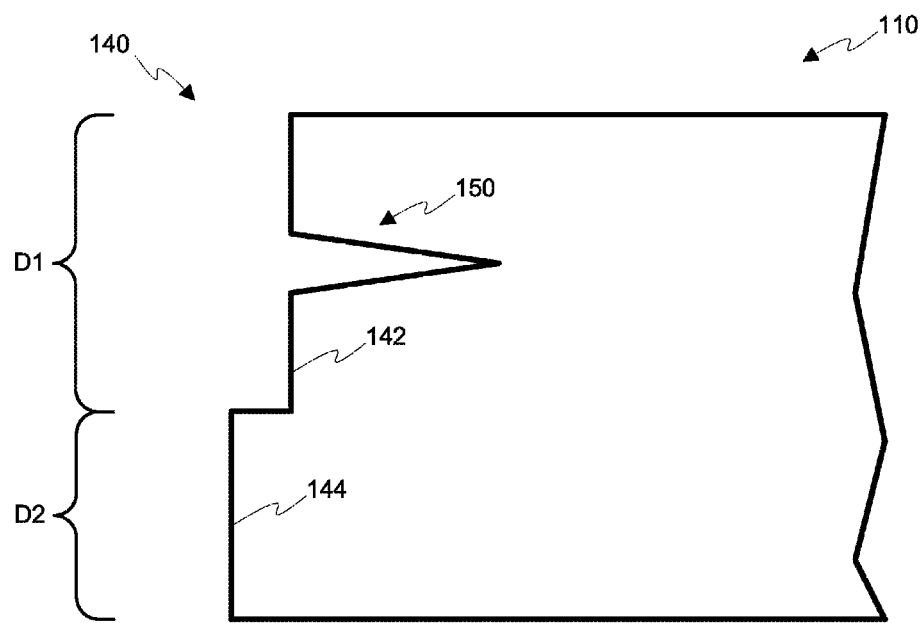
FIG. 2 shows a cracked sidewall of a singulated die from the wafer of FIG. 1.

Referring now to FIG. 2, a sidewall 140 of a singulated die 110 is shown. Singulation or dicing of the wafer 100 into dies 110 may be accomplished in a step-wise fashion. For example, a first saw blade may be used to partially dice the wafer 100 down to a first depth D1. Then, a second wider saw blade may be used to cut the rest of the way through the wafer 100 down to a second depth D2. Such multi-stage or step-wise singulation of the wafer 100 may result in the die 110 having a stepped or tiered sidewall 140. For example, FIG. 2 depicts the sidewall 140 with a first tier 142 and a second tier 144. While a dicing process may use blades of varying widths as shown, dicing of the wafer 100 may also be accomplished using a single saw blade. Such a dicing process may result in the sidewalls 140 that are without a stepped or tiered surface. Such a sidewall 140 may be referred to as a single-tiered sidewall. Similarly, the dicing process may use more than two saw blades of varying widths, which may result in the sidewall 140 having more than the two depicted tiers 142, 144.

As further shown in FIG. 2, the dicing process may cause one or more cracks 150 or other structural defects along or into the sidewall 140. Such structural defects are referred to hereafter as cracks for the sake of brevity and clarity. FIG. 2 depicts a single crack 150 that extends into the surface of the first tier 142 of the sidewall 140. However, the depicted crack 150 is merely illustrative. Cracks 150 may form in, along, or across the various one or more tiers 142, 144 of the sidewall 140 as a result of the dicing process.

Due to such cracks 150, the sidewall 140 may lack the structural integrity required to withstand even modest physical contact. In particular, additional cracks 150 may form or existing cracks 150 may be exacerbated by further physical contact. Thus, an integrated circuit 120, that functioned appropriately after singulation of its die 110, may develop defects or become inoperative as cracks 150 propagate from the sidewall 140 toward the integrated circuit 120 formed in the singulated die 110.

Various dicing or singulation methods are discussed below which coat the sidewall 140 in an attempt to increase the structural integrity of the sidewall 140. Such coating may also reduce the likelihood of further physical contact rendering the integrated circuit 120 of the singulated die 110 defective or inoperative.

Referring now to FIGS. 3A-3G, a dicing method is shown. In general, the dicing method utilizes a catalyst to selectively coat sidewalls 140 with a polymer such as a cured, silicone resin. The applied polymer coating may help increase the structural integrity of the sidewalls 140 and may help prevent further physical damage to the die 110 and its integrated circuit 120. The polymer coating may be especially helpful in protecting a singulated die 110 that is packaged in a manner that exposes the sidewalls 140 of the singulated die 110. However, the polymer coating may also be useful in protecting a singulated die 110 that is packaged in a manner that does not expose the sidewalls 140.

Figure 3A:
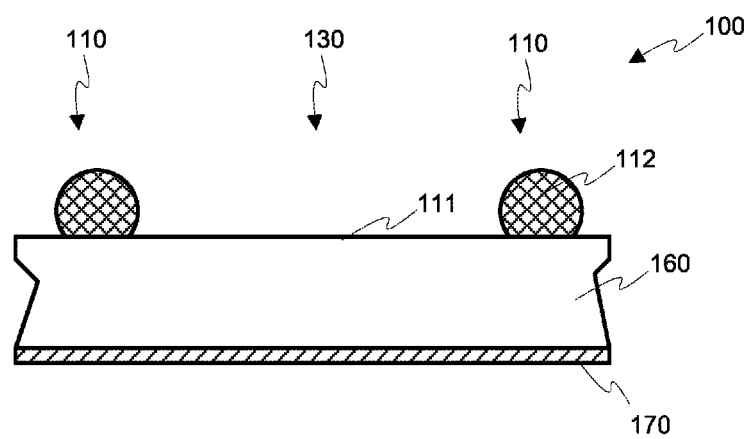
FIGS. 3A-3G show a method that uses a curing agent to cover a cracked sidewall of a singulated die with a polymer.

A prepared, semiconductor wafer 100 prior to dicing is shown in FIG. 3A. As noted above, the semiconductor wafer 100 may comprise an array of dies 110 each having an integrated circuit 120. See, e.g., FIG. 1. The prepared semiconductor wafer 100 may further include one or more structures 112 such as pads or solder balls. Such structures 112 may provide an electrical connection to the integrated circuits 120 of the singulated dies 110. As shown in FIG. 1, the semiconductor wafer 100 may include an array of dies 110. However, in the interest of clarity, FIGS. 3A-3G only depict a portion of two dies 110 and their adjoining street 130.

As shown, the wafer 100 may comprise a semiconductor substrate 160 and a backside coating 170. The integrated circuits 120 of the array of dies 100 may be formed on and/or in the semiconductor substrate 160. The backside coating 170 may protect the semiconductor substrate 160 and its integrated circuits 120 during the dicing process. The backside coating 170 may further include an inhibiting agent that inhibits curing of the polymer used to coat the sidewalls 140. For example, the backside coating 170 may comprise an amine-cure type backside coating material, which includes amine that inhibits curing of a silicone resin to the backside coating 170.

Figure 3B:
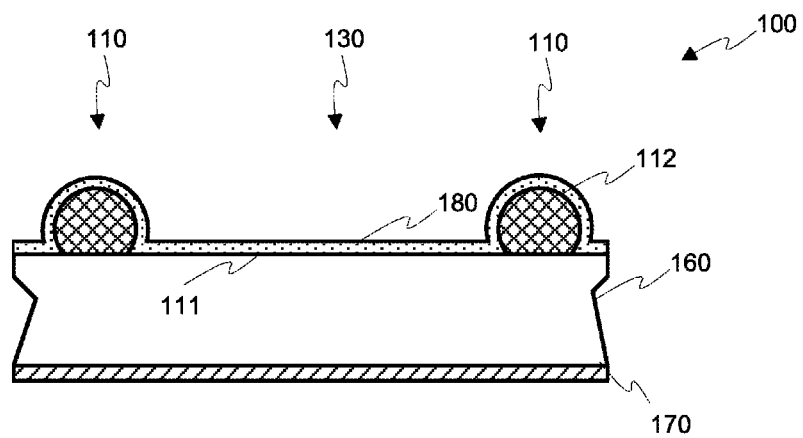

An upper surface 111 of the semiconductor wafer 100 and any structures 112 formed thereon may be covered with a preventative coating 180 as shown in FIG. 3B. In one embodiment, the preventative coating 180 may include a hydrophobic material such as, for example, polydimethylsiloxane that may be applied as a monolayer having a thickness of less than 10 nanometers (nm). However, the preventative coating 180 may include other hydrophobic materials and/or applied thicknesses, which may be used to prevent a later introduced catalyst from adhering to the upper surface 111 and structures 112. In one embodiment, the preventative coating 180 may be applied to the upper surface 111 and structures 112 via dipping, spraying, spin coating, or another application technique.

In embodiments, the preventative coating 180 may include a curing inhibitor (e.g. amine), which may prevent a polymer (e.g., silicone resin) from curing along the upper surface 111 of the semiconductor wafer 100 and any structures 112 formed. For example, the preventative coating 180 may include amine, which may capture a later applied catalyst and thereby prevent curing of a silicone resin to the surface 111 and structures 112.

Figure 3C:
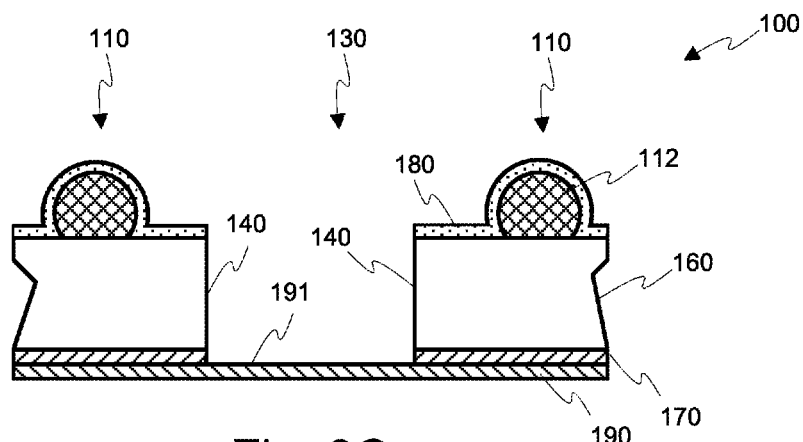

As shown in FIG. 3C, the wafer 100 may be applied to a dicing tape 190. In particular, the dicing tape 190 may provide an adhesive binding to the backside coating 170 on the wafer 100. Further, the dicing tape 190 may be attached to a film frame or ring (not shown) that aids in the handling of the dicing tape 190 and the attached wafer 100. In general, the dicing tape 190 may ensure that the individual dies 110 remain firmly in place during dicing of the wafer 100.

As further shown in FIG. 3C, the wafer 100 may be diced along streets 130 of the wafer 100. During the dicing process, the wafer 100, which may include a thousand or more integrated circuits 120, is cut into separate rectangular pieces or dies 110 along the streets 130. The streets 130 generally provide thin non-functional spacing between the integrated circuits 120 along which a saw or other dicing tool may safely cut the wafer 100 without damaging the integrated circuits 120. The width of the streets 130 may be very small, e.g., around 100 μm. As such a very thin and accurate saw may be used to dice the wafer 100 into its individual dies 110. In some embodiments, a water-cooled circular saw with diamond-tipped teeth may be used to dice the wafer 100. As discussed above, the dicing may be performed in stages using blades of varying widths. Such blades may comprise a metal or resin bond containing abrasive grit of natural or synthetic diamond. Furthermore, the dicing may result in dies 110 with tiered sidewalls 140 and cracks 150 as shown in FIG. 2.

Figure 3D:
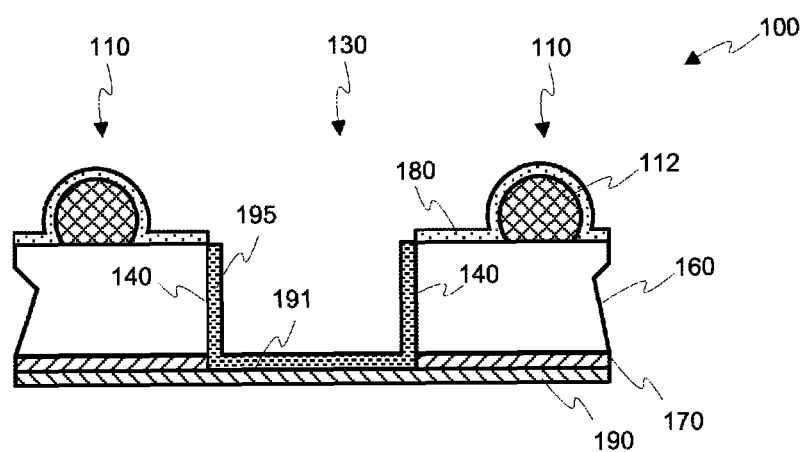

After dicing the wafer 100, a curing agent coating 195 is formed along the sidewalls 140 as shown in FIG. 3D. As shown in FIG. 3D, sidewalls 140 of dies 110 along an adjoining street 130 may face each other and form a trench between such adjoining dies 110. The curing agent coating 195 along such sidewalls 140 may include a catalyst or curing agent for curing a later applied polymer. In one embodiment, the curing agent coating 195 may include a metal catalyst selected from platinum (Pt), tin (Sn), a group comprising transition metals and alkaline earth metals. In some embodiments, the curing agent coating 195 may include the selected metal catalyst in alcohol. The curing agent coating 195 may be applied to the sidewalls 140 of the wafer 100 via spraying, dipping, spin coating, a positive displacement pump, a jet pump, or some other application technique. As a result of such application, the catalyst of the curing agent coating 195 coats the sidewalls 140. The catalyst also coats of an upper surface 191 of the dicing tape 190, which was exposed as a result of sawing away the adjoining street 130. However, the preventative coating 180, that was applied in FIG. 3B, may include a hydrophobic material that prevents the catalyst or curing agent of the curing agent coating 195 from coating the upper surface 111 and structures 112 of the wafer 100. In other embodiments, the preventative coating 180, that was applied in FIG. 3B, may include a curing inhibitor that absorbs the catalyst or curing agent of the curing agent coating 195 and prevents curing of a later applied polymer to the upper surface 111 and structures 112 of the wafer 100.

Figure 3E:
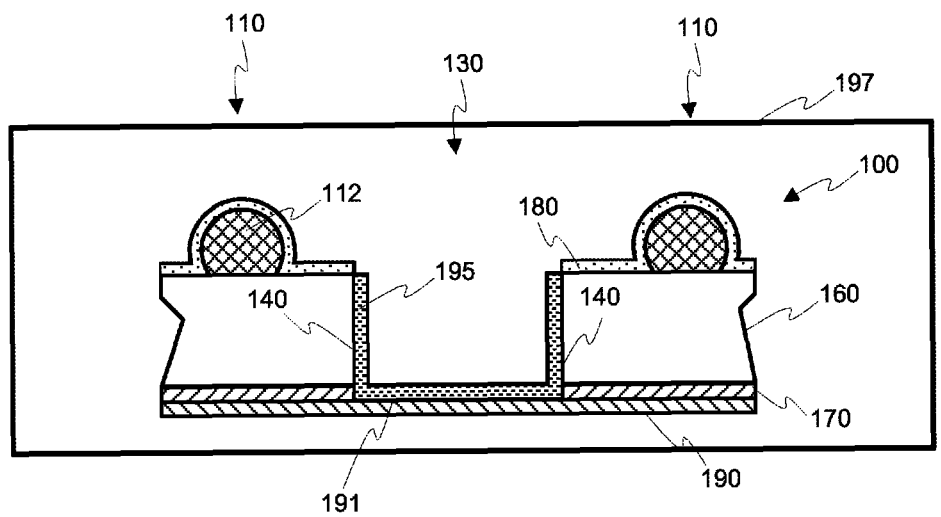

As shown in FIG. 3E, a polymer may be applied to the wafer 100. In one embodiment, the wafer 100 and attached film frame may be immersed in a polymer bath 197 comprising a polymer that cures in the presence of the curing agent or catalyst applied to the sidewalls 140. In such an embodiment, the wafer 100 is immersed in a silicone resin bath 197, which comprises a silicone resin that cures in the presence of a Pt catalyst. As such, the silicone resin 198 may cure along the sidewalls 140 and along the upper surface 191 of the dicing tape 190 due to the presence of the catalyst provided by the curing agent coating 195. See, e.g., FIG. 3F. While the wafer 100 may be immersed in a polymer bath 197, the polymer 197 in other embodiments may be applied to the wafer 100 via other techniques such as dispensing the polymer. Regardless of the application technique, the silicone resin 198 may cure along the sidewall 140 and/or upper surface 191 to a thickness of 1 to 10 μm, 1 to 50 μm, or up to half the width of the street 130.

Figure 3F:
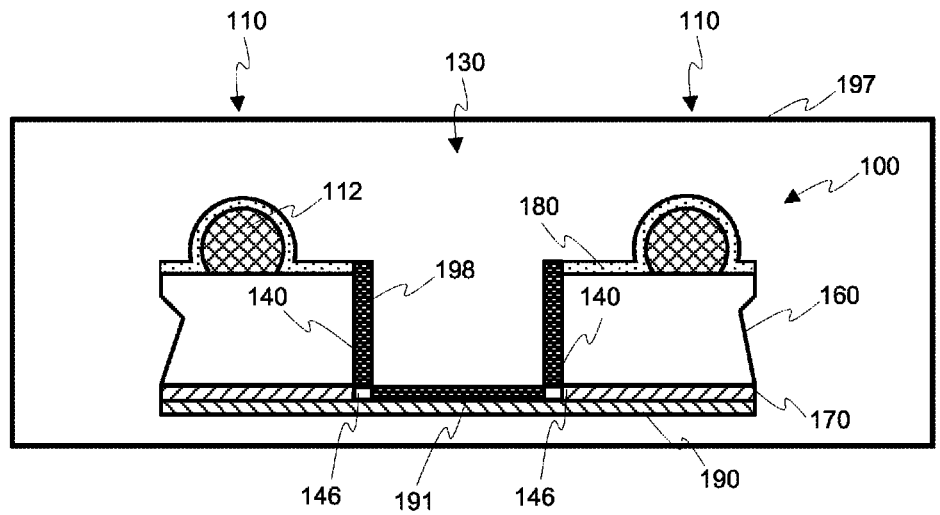
Figure 3G:
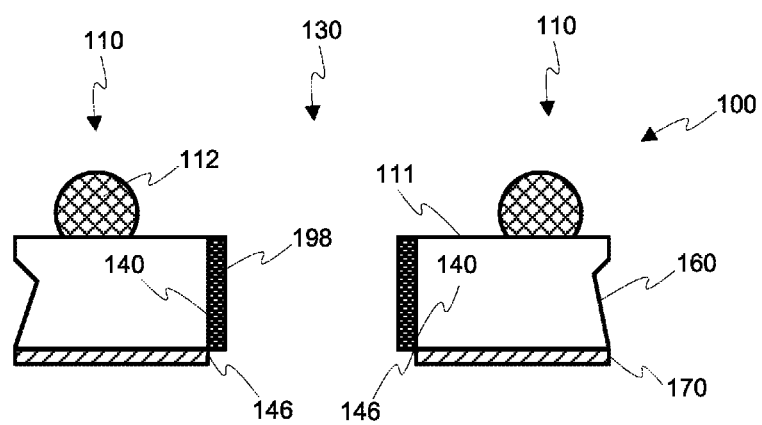

As also shown in FIG. 3F, a curing inhibitor (e.g. amine) in the backside coating 170 may prevent the polymer (e.g., silicone resin) 198 from curing along an edge 146 of the sidewall 140 near the backside coating 170. For example, amine in the backside coating 170 may capture the catalyst and thereby prevent curing of the silicone resin at the edge 146. Inhibiting curing of the polymer 198 near the edge 146 may aid in picking the dies 110 from the dicing tape 190 without damaging the sidewalls 140 and/or the polymer 198 cured to the sidewalls 140 as shown in FIG. 3G. In particular, the singulated dies 110 may be cleaned and picked from the dicing tape 190. In particular, the preventative coating 180 may be removed by ashing prior to picking the cleaned dies 110 from the tape 190.

Thus, per the above described dicing method, the sidewalls 140 of the singulated dies 110 may be coated with a polymer 198 such as silicone resin that covers cracks 150 in the sidewalls 140. By covering such defects, the polymer 198 may increase the structural integrity of the sidewalls 140, may help prevent additional cracks 150 forming in the sidewall 140, and may help prevent the propagation of existing cracks 150 toward the integrated circuit 130. As such, the polymer 198 may reduce the likelihood that further physical contact with the sidewalls 140 causes or exacerbates structural defects in the sidewall 140 that render an integrated circuit 120 defective or inoperable.

Referring now to FIGS. 4A-4D, another dicing method is shown. In general, the dicing method fills cracks 150 in sidewalls 140 with a polymer. Filling the cracks 150 with polymer may increase the structural integrity of the sidewalls 140 and may aid in preventing further physical damage to the die 110 and its integrated circuit 120. Such filling may be especially helpful in protecting a singulated die 110 that is packaged in a manner that exposes the sidewalls 140 of the singulated die 110. However, such filling may also be useful in protecting a singulated die 110 that is packaged in a manner that does not expose the sidewalls 140.

Figure 4A:
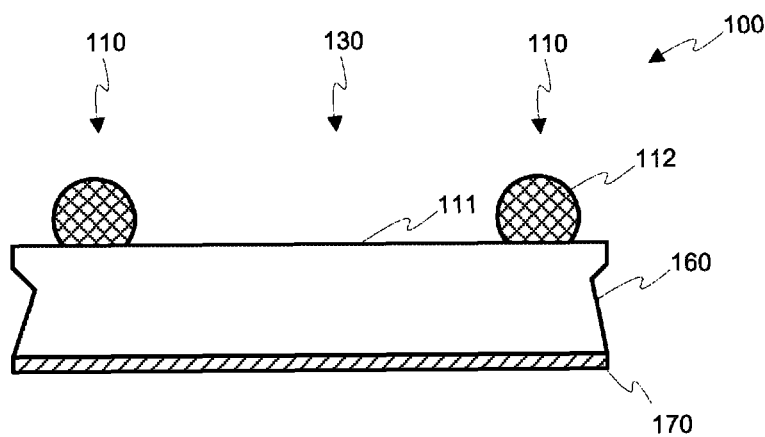
FIGS. 4A-4D show a method of filling cracks in the sidewall of a singulated die with a polymer.

A prepared, semiconductor wafer 100 is shown prior to dicing in FIG. 4A. As noted above, the semiconductor wafer 100 may comprise an array of dies 110 each having an integrated circuit 120. See, e.g., FIG. 1. The prepared semiconductor wafer 100 may further include one or more structures 112 such as pads or solder balls. Such structures 112 may provide an electrical connection to the integrated circuits 120 of the singulated dies 110. As shown in FIG. 1, the semiconductor wafer 100 may include an array of dies 110. However, in the interest of clarity, FIGS. 4A-4D only depict a portion of two dies 110 and their adjoining street 130.

As shown, the wafer 100 may comprise a semiconductor substrate 160 and a backside coating 170. The integrated circuits 120 of the array of dies 100 may be formed on and/or in the semiconductor substrate 160. The backside coating 170 may protect the semiconductor substrate 170 and its integrated circuits 120 during the dicing process.

Figure 4B:
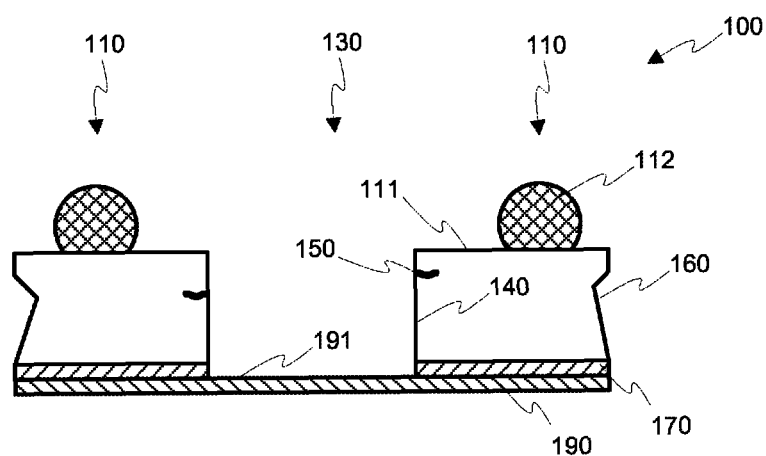

As shown in FIG. 4B, the wafer 100 may be applied to a dicing tape 190. In particular, the dicing tape 190 may provide an adhesive binding to the backside coating 170 on the wafer 100. Further, the dicing tape 190 may be attached to a film frame or ring (not shown) that aids in the handling of the dicing tape 190 and the attached wafer 100. In general, the dicing tape 190 may ensure that the individual dies 110 remain firmly in place during dicing or singulation of the wafer 100.

As further shown in FIG. 4B, the wafer 100 may be diced along streets 130 of the wafer 100. During the dicing or singulation process, the wafer 100, which may include a thousand or more integrated circuits 120, is cut into separate rectangular pieces or dies 110 along the streets 130. As noted above, the streets 130 provide thin non-functional spacing between the integrated circuits 120 along which a saw or other singulation tool may safely cut the wafer 100 without damaging the integrated circuits 120. Such dicing, however, may result in dies 110 with cracks 150 in sidewalls 140.

Figure 4C:
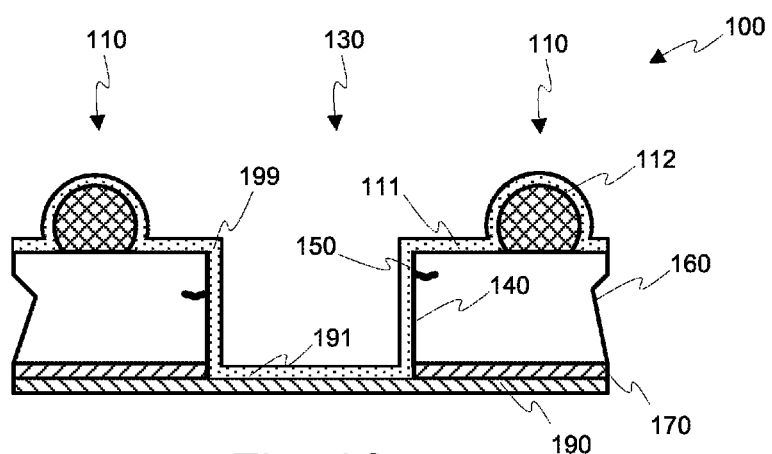

After dicing, a polymer 199 such as a parylene coating is formed along the sidewalls 140 as shown in FIG. 4C. In particular, the polymer 199 is applied via vapor deposition in a vacuum environment to ensure that polymer penetrates and seals the cracks 150 in the side walls 140. In one embodiment, parylene is used for the polymer 199. Parylene has various properties, which make it suitable for filling the cracks 150. In particular, vapor deposition of parylene is capable of penetrating submicron cracks. Furthermore, parylene adheres well to oxides and has a tensile strength similar to epoxy. As such, parylene is capable of filling the small cracks 150 formed in the sidewalls 140 due to the dicing or singulation process. Moreover, the parylene, as a result of such filling, may essentially "glue" structural aspects of the sidewall 140 together and increase the overall structural integrity of the sidewall 140.

In order to receive the parylene coating, the wafer 100 may be placed in a deposition chamber at a pressure of roughly 100 mTorr. A vaporizer may vaporize the solid dimer at approximately 150° C. Then, quantitative cleavage (pyrolysis) of the dimer occurs at the two methylene-methylene bonds at about 680° C. to yield the stable monomeric diradical, para-xylylene. Finally, the monomer is introduced into a deposition chamber at roughly room temperature, e.g., 25° C., where the monomer simultaneously adsorbs and polymerizes on the wafer 100 and in the cracks 150. As a result of such vapor deposition, parylene fills in the cracks 150. Besides filling in the cracks 150, parylene also forms on the upper surface 111 of the wafer 100, on the structures 112, on the sidewalls 140, and the upper surface 191 of the dicing tape 190 as shown in FIG. 4C. In one embodiment, the parylene is deposited to a thickness of between 0.01 and 20 µm.

Figure 4D:
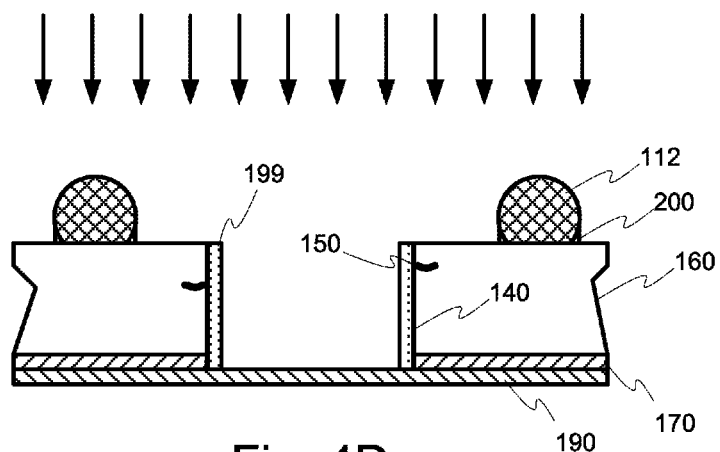

Finally, as shown in FIG. 4D, the vapor deposited polymer 199 may be removed from horizontal surfaces of the wafer 100 and structures 112. To this end, the wafer 100 may be subjected to a directional ion etching. In particular, in one embodiment, the directional ion etching uses an $O_2$ etchant at a flow rate of 50 standard cubic centimeter per minute (sccm), a power of 300 watts, and a pressure of 300 mTorr to remove the parylene from the horizontal surfaces as shown in FIG. 4D. Due to the directional nature of the etching process, polymer remnants 200 may remain. For example, structures 112 may effectively shadow and prevent the directional ion etching from removing the polymer 200 near a base of the structure 112. In an example implementation, however, in which the structures 112 comprise relatively vertical side walls (e.g., various configurations of metal pillars or posts, etc.), the polymer remnants 200 may for example not be present. Similarly, upper horizontal portions of cracks 150 may effectively shadow and prevent the directional ion etching from removing the polymer 198 from the cracks 150.

After removing the polymer 199, the dies 110 may be removed from the backing tape 190 and packaged to form semiconductor devices suitable for mounting to a printed circuit board.

Referring now to FIGS. 5A-5F, yet another dicing method is shown. In general, the dicing method of FIGS. 5A-5F heats a singulated die 110 to selectively coat sidewalls 140 with a polymer such as a cured, silicone resin. The applied polymer coating may help increase the structural integrity of the sidewalls 140 and may help prevent further physical damage to the die 110 and its integrated circuit 120. The polymer coating may be especially helpful in protecting a singulated die 110 that is packaged in a manner that exposes the sidewalls 140 of the singulated die 110. However, the polymer coating may also be useful in protecting a singulated die 110 that is packaged in a manner that does not expose the sidewalls 140.

Figure 5A:
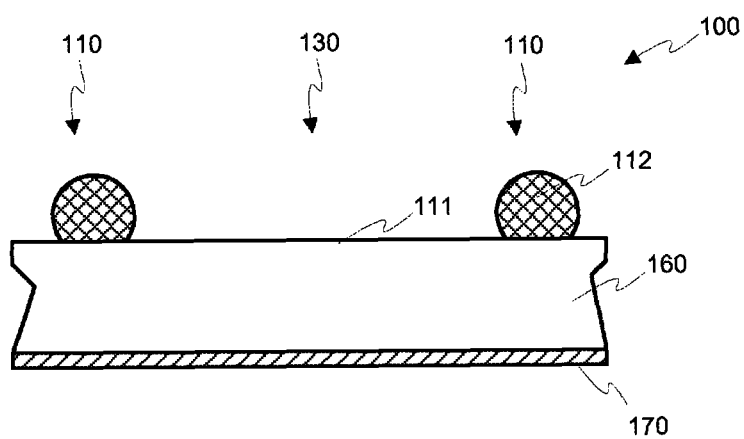
FIGS. 5A-5F show a method that uses radiation to heat a cracked sidewall of a singulated die and cure a polymer to heated sidewall.

A prepared, semiconductor wafer 100 prior to dicing is shown in FIG. 5A. As noted above, the semiconductor wafer 100 may comprise an array of dies 110 each having an integrated circuit 120. See, e.g., FIG. 1. The prepared semiconductor wafer 100 may further include one or more structures 112 such as pads or solder balls. Such structures 112 may provide an electrical connection to the integrated circuits 120 of the singulated dies 110. As shown in FIG. 1, the semiconductor wafer 100 may include an array of dies 110. However, in the interest of clarity, FIGS. 5A-5F only depict a portion of two dies 110 and their adjoining street 130.

As shown, the wafer 100 may comprise a semiconductor substrate 160 and a backside coating 170. The integrated circuits 120 of the array of dies 100 may be formed on and/or in the semiconductor substrate 160. The backside coating 170 may protect the semiconductor substrate 160 and its integrated circuits 120 during the dicing process. The backside coating 170 may further include an inhibiting agent that inhibits curing of the polymer used to coat the sidewalls 140. For example, the backside coating 170 may comprise an amine-cure type backside coating material, which includes amine that inhibits curing of a silicone resin to the backside coating 170.

Figure 5B:
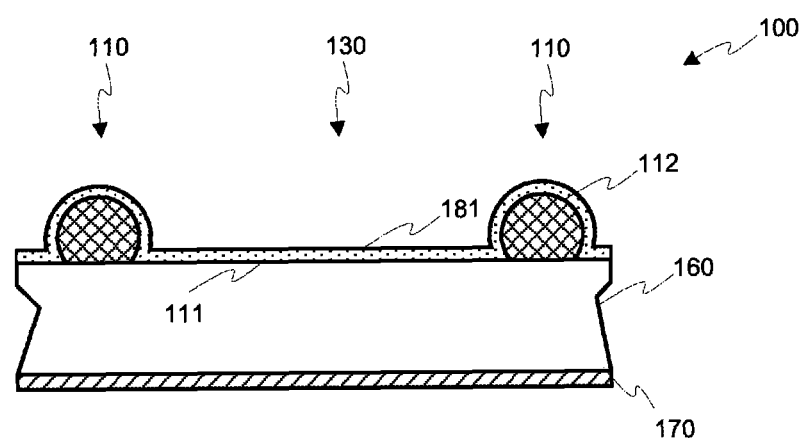

An upper surface 111 of the semiconductor wafer 100 and any structures 112 formed thereon may be covered with a hydrophobic coating 181 as shown in FIG. 5B. In one embodiment, the hydrophobic coating 181 may include polydimethylsiloxane and may be applied as a monolayer having a thickness of less than 10 nanometers (nm). However, other hydrophobic coatings 181 and/or thicknesses may be used to prevent a later introduced catalyst from adhering to the upper surface 111 and structures 112. In one embodiment, the hydrophobic coating 181 may be applied to the upper surface 111 and structures 112 via dipping, spraying, spin coating, or another application technique.

Figure 5C:
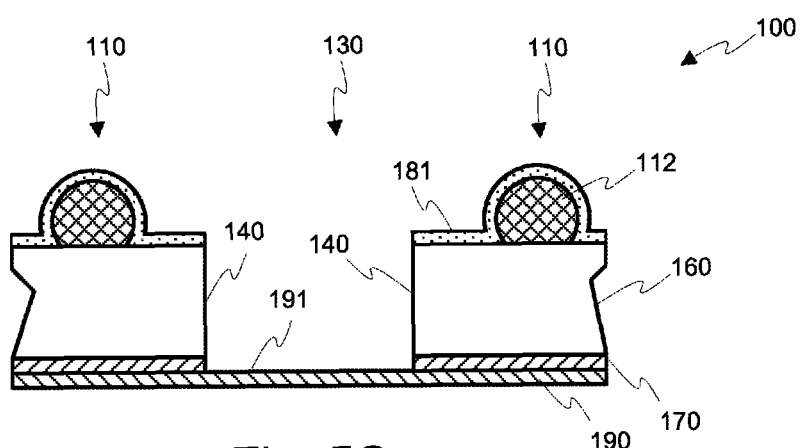
Figure 5D:
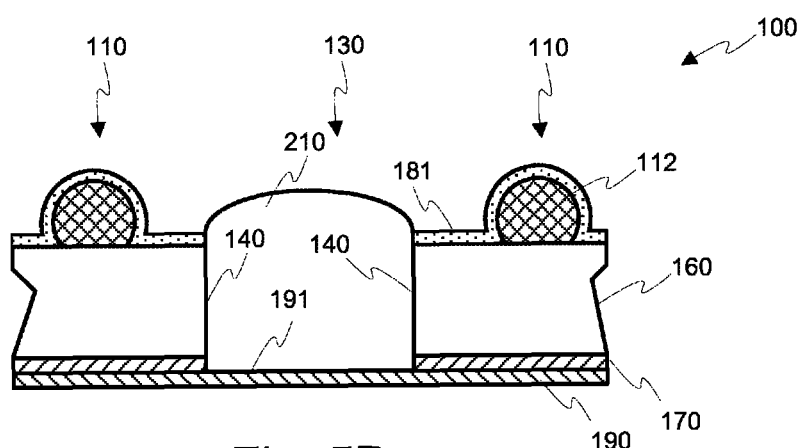

As shown in FIG. 5C, the wafer 100 may be applied to a dicing tape 190. In particular, the dicing tape 190 may provide an adhesive binding to the backside coating 170 on the wafer 100. Further, the dicing tape 190 may be attached to a film frame or ring (not shown) that aids in the handling of the dicing tape 190 and the attached wafer 100. In general, the dicing tape 190 may ensure that the individual dies 110 remain firmly in place during dicing of the wafer 100.

As further shown in FIG. 5C, the wafer 100 may be diced along streets 130 of the wafer 100. During the dicing process, the wafer 100, which may include a thousand or more integrated circuits 120, is cut into separate rectangular pieces or dies 110 along the streets 130. The streets 130 generally provide thin non-functional spacing between the integrated circuits 120 along which a saw or other dicing tool may safely cut the wafer 100 without damaging the integrated circuits 120. The width of the streets 130 may be very small, e.g., around 100 μm. As such a very thin and accurate saw may be used to dice the wafer 100 into its individual dies 110. In some embodiments, a water-cooled circular saw with diamond-tipped teeth may be used to dice the wafer 100. As discussed above, the dicing may be performed in stages using blades of varying widths. Such blades may comprise a metal or resin bond containing abrasive grit of natural or synthetic diamond. Furthermore, the dicing may result in dies 110 with tiered sidewalls 140 and cracks 150 as shown in FIG. 2.

After dicing the wafer 100, a polymer 210 may be applied to the street 130 as shown in 5D. In particular, the polymer 210 may include a polymer such as, for example, a silicone resin that cures in the presence of heat. Furthermore, as shown, the hydrophobic coating 181 may repel the polymer 210 and prevent the polymer 210 from wetting structures 112 and the upper surface 111 of the wafer 100.

Figure 5E:
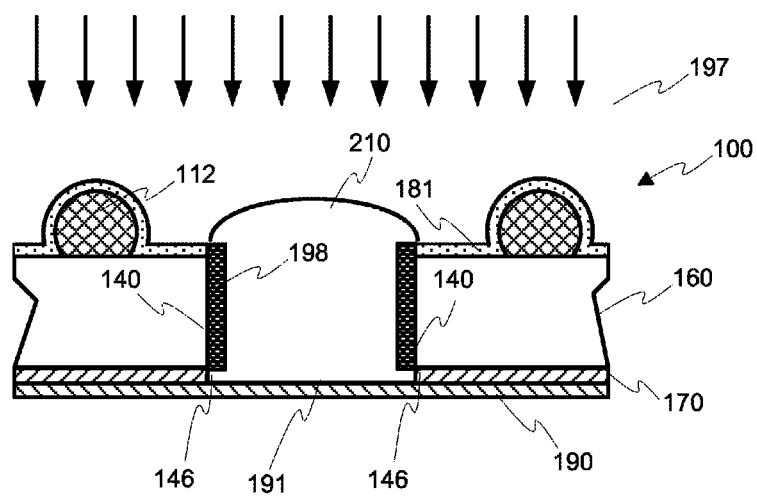

As also shown in FIG. 5E, the film frame (not shown) including the singulated dies 110 and uncured polymer 210 are then exposed to radiation at a wavelength that silicon wafer 100 absorbs but the polymer 210 does not. In one embodiment, such wavelengths may correspond to microwave, infrared, and/or near infrared spectrum. As a result of such absorption, the radiation heats the semiconductor wafer 100 including its sidewalls 140 without directly heating the polymer 210 or the backside coating 170. Such heating may cause the polymer 210 to cure to the sidewalls 140 and form a polymer coating 198 along such sidewalls 140 without curing to the backside coating 170.

Figure 5F:
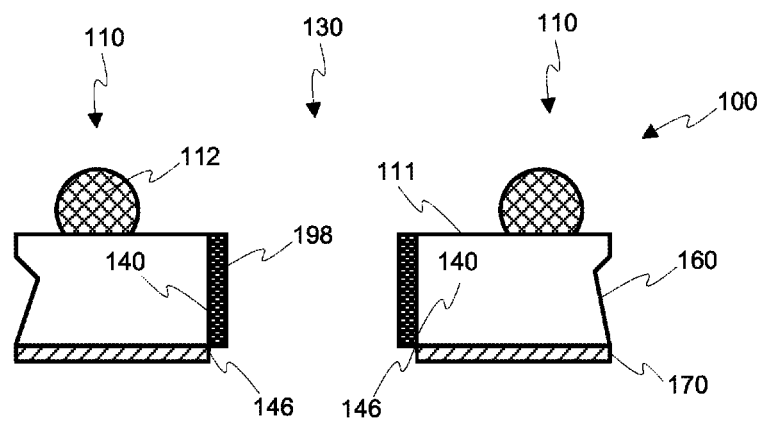

Preventing formation of the polymer coating 198 near the edge 146 may aid in picking the dies 110 from the dicing tape 190 without damaging the sidewalls 140 and/or the polymer coating 198 cured to the sidewalls 140 as shown in FIG. 5F. In particular, the singulated dies 110 may be cleaned and picked from the dicing tape 190. More specifically, the hydrophobic coating 181 may be removed by ashing prior to picking the cleaned dies 110 from the tape 190.

Thus, per the above described dicing method, the sidewalls 140 of the singulated dies 110 may be coated with a polymer 198 such as silicone resin that covers cracks 150 in the sidewalls 140. By covering such defects, the polymer 198 may increase the structural integrity of the sidewalls 140, may help prevent additional cracks 150 forming in the sidewall 140, and may help prevent the propagation of existing cracks 150 toward the integrated circuit 130. As such, the polymer 198 may reduce the likelihood that further physical contact with the sidewalls 140 causes or exacerbates structural defects in the sidewall 140 that render an integrated circuit 120 defective or inoperable.

Aspects of the present disclosure have been described with reference to certain embodiments. However, various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment or embodiments disclosed, but that the present disclosure encompasses all embodiments falling within the scope of the appended claims.

What is claimed is:

1. A method, comprising:
   forming, on a wafer, a backside coating comprising an inhibiting agent;
   after said forming, dicing the wafer into a plurality of dies to form a first sidewall of a first die and a second sidewall of a second die that faces the first sidewall;
   applying a polymer to the first sidewall of the first die and the second sidewall of the second die to form a first polymer coating along the first sidewall and a second polymer coating along the second sidewall that faces the first polymer coating;
   curing the polymer along the first sidewall and the second sidewall; and
   inhibiting, via the inhibiting agent, curing of the polymer adjacent to the backside coating.

2. The method of claim 1, further comprising:
   applying, to the first sidewall of the first die, a curing agent comprising a catalyst for curing the polymer; and
   applying the polymer to the first sidewall of the first die after said applying the curing agent;
   wherein said curing comprises curing the polymer along the first sidewall of the first die due to presence of the curing agent.

3. The method of claim 2, wherein said curing agent comprises a catalyst.

4. The method of claim 2, wherein said curing the polymer comprises forming the first polymer coating along the first sidewall of the first die to a thickness of 1 to 50 micrometers (μm).

5. The method of claim 2, wherein said inhibiting comprises inhibiting curing of the polymer along an edge of the first sidewall that is adjacent to the backside coating.

6. The method of claim 1, further comprising:
   forming a preventative coating over an upper surface of the wafer before said dicing; and
   applying a curing agent to the upper surface of the wafer and the first sidewall of the first die after said dicing;
   wherein said applying the curing agent forms a curing agent coating over the first sidewall due to absence of the preventative coating on the first sidewall and does not form the curing agent coating over the upper surface of the wafer due to presence of the preventative coating on the upper surface of the wafer.

7. The method of claim 1, wherein said applying comprises filling one or more cracks in the first sidewall with the polymer via vapor deposition.

8. The method of claim 7, further comprising removing the polymer from horizontal surfaces of the wafer via directional ion etching, wherein the polymer comprises parylene and the directional ion etching uses O2 as an etchant.

9. The method of claim 8, wherein said polymer comprises parylene deposited to a thickness of between 0.01 to 20 μm.

10. The method of claim 2, wherein said curing the polymer along the first sidewall of the first die comprises heating the first sidewall of the first die.

11. The method of claim 2, wherein said curing the polymer along the sidewall of the first die comprises exposing the first die to radiation having a wavelength absorbed by the first die.

12. A method, comprising:
  forming a preventative coating over an upper surface of a wafer;
  forming, over a backside surface of the wafer, a backside coating comprising an inhibiting agent;
  after said forming said backside coating, dicing the wafer into a plurality of dies to form a sidewall of a die that lacks the preventative coating;
  applying a curing agent to the upper surface of the wafer and the sidewall of the die after said dicing, wherein said applying the curing agent forms a curing agent coating over the sidewall due to absence of the preventative coating;
  curing a polymer to the sidewall of the die due to presence of the curing agent on the sidewall of the die; and
  inhibiting, via the inhibiting agent, curing of the polymer adjacent to the backside coating.

13. The method of claim 12, wherein said curing agent comprises a catalyst.

14. The method of claim 12, wherein said curing the polymer comprises forming the polymer coating along the sidewall of the die to a thickness of 1 to 50 micrometers (μm).

15. The method of claim 12, wherein said inhibiting comprises inhibiting curing of the polymer along an edge of the sidewall that is adjacent to the backside coating.

16. The method of claim 12, wherein the forming the preventative coating comprises applying a hydrophobic material over the upper surface of the wafer.

17. The method of claim 12, wherein the forming the preventative coating comprises applying, over the upper surface of the wafer, the inhibiting agent that inhibits the curing agent.

18. A semiconductor device, comprising:
  a semiconductor die having an upper surface, a backside surface, and a sidewall adjoining the upper surface to the backside surface;
  a backside coating comprising a top surface along the backside surface of the semiconductor die, a bottom surface opposite the top surface, an edge adjacent the sidewall and adjoining the top surface to the bottom surface, and an inhibiting agent that inhibits curing of a polymer along the edge of the backside coating; and
  a coating along the sidewall of the semiconductor die, the coating comprising the polymer cured to the sidewall of the semiconductor die such that the coating traverses the sidewall from the upper surface to the backside surface of the semiconductor die but not along the edge of the backside coating due to the inhibiting agent.

19. The semiconductor device of claim 18 wherein the coating covers defects in the sidewall of the semiconductor die.

20. The semiconductor device of claim 18 wherein the coating fills cracks in the sidewall of the semiconductor die.

* * * * *